United States Patent
Nakamura

(10) Patent No.: US 10,757,814 B2
(45) Date of Patent: Aug. 25, 2020

(54) METHOD FOR MANUFACTURING A CIRCUIT BOARD

(71) Applicant: Panasonic Intellectual Property Management Co., Ltd., Osaka (JP)

(72) Inventor: Nobuhiko Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 66 days.

(21) Appl. No.: 16/092,795

(22) PCT Filed: Apr. 26, 2017

(86) PCT No.: PCT/JP2017/016515
§ 371 (c)(1),
(2) Date: Oct. 11, 2018

(87) PCT Pub. No.: WO2017/188306
PCT Pub. Date: Feb. 11, 2017

(65) Prior Publication Data
US 2019/0174629 A1    Jun. 6, 2019

(30) Foreign Application Priority Data
Apr. 28, 2016   (JP) ................. 2016-091327

(51) Int. Cl.
  *H05K 3/34*   (2006.01)
  *H05K 1/18*   (2006.01)
  *H05K 3/30*   (2006.01)

(52) U.S. Cl.
  CPC ............ *H05K 1/184* (2013.01); *H05K 1/183* (2013.01); *H05K 3/306* (2013.01); *H05K 3/3447* (2013.01);
(Continued)

(58) Field of Classification Search
  CPC ........ H05K 1/182; H05K 1/183; H05K 1/184; H05K 3/306; H05K 3/3447; H05K 3/3468
  See application file for complete search history.

(56) References Cited

U.S. PATENT DOCUMENTS 4,218,701 A  *  8/1980  Shirasaki ............. H01L 23/057
                                                      174/521
6,215,101 B1 *  4/2001  Kondo .................. H05K 3/301
                                                      174/535
(Continued)

FOREIGN PATENT DOCUMENTS

JP    58-162662 U    10/1983
JP    2-028991       1/1990
(Continued)

OTHER PUBLICATIONS

International Search Report of PCT application No. PCT/JP2017/016515 dated Jun. 13, 2017.

*Primary Examiner* — Paul D Kim
(74) *Attorney, Agent, or Firm* — McDermott Will & Emery LLP

(57) ABSTRACT

A circuit board manufacturing method which includes inserting either a first claw or a second claw through a notch formed by notching an edge of a hole of a wiring board. The first claw and the second claw project outward from a wall portion of a cover member. The cover member is held on the wiring board, by sliding the cover member relative to the wiring board to position the edge of the hole between the first claw and the second claw provided on a surface of the wall portion identical to a surface on which the first claw is provided. The cover member is detached from the wiring board, by sliding the cover member relative to the wiring
(Continued)

board to shift the first claw from the component mounting surface side to a soldering surface side with the first claw passing through the notch.

1 Claim, 14 Drawing Sheets

(52) U.S. Cl.
CPC ........... *H05K 3/3468* (2013.01); *H05K 1/182* (2013.01); *H05K 2201/09063* (2013.01); *H05K 2201/09072* (2013.01); *H05K 2201/2018* (2013.01); *H05K 2203/0169* (2013.01); *H05K 2203/044* (2013.01)

(56) References Cited

U.S. PATENT DOCUMENTS

| | | | |
|---|---|---|---|
| 6,326,875 B1 | 12/2001 | Tuovinen | |
| 6,609,295 B1* | 8/2003 | Koyama | H05K 13/0473 29/566.3 |
| 6,686,226 B1* | 2/2004 | Tsunoda | H01L 21/565 438/123 |
| 2011/0085310 A1* | 4/2011 | Cachia | H05K 1/182 361/764 |
| 2017/0149222 A1* | 5/2017 | Kobayashi | H02G 3/081 |

FOREIGN PATENT DOCUMENTS

| | | |
|---|---|---|
| JP | 3-195088 | 8/1991 |
| JP | 2000-349428 | 12/2000 |
| JP | 2005-072441 | 3/2005 |

\* cited by examiner

METHOD FOR MANUFACTURING A CIRCUIT BOARD

This application is a U.S. national stage application of the PCT International Application No. PCT/JP2017/016515 filed on Apr. 26, 2017, which claims the benefit of foreign priority of Japanese patent application No. 2016-091327 filed on Apr. 28, 2016, the contents all of which are incorporated herein by reference.

TECHNICAL FIELD

The present disclosure relates to a method for manufacturing a circuit board including: a wiring board that has a surface provided with a wire pattern; and a component, such as an electronic component and an electric component, being mounted on the wiring board, relates to a circuit board, and relates to a cover member used during manufacture.

BACKGROUND ART

For manufacturing a circuit board, wiring provided on a surface of a wiring board, and an electrode terminal of a component mounted on the wiring board need to be electrically connected to each other. Soldering is generally used for establishing such an electrical connection. Flow soldering is known as one of industrial soldering methods. Flow soldering is a method for pressing the wiring board from a side where the wiring is partially exposed against molten solder in an injected state to achieve soldering between an electrode terminal and wiring.

However, in some cases, a component is mounted on the wiring board on a side where solder is applied, or the wiring board has a portion to which solder should not be applied, such as a land. It is therefore necessary to shield the component and the portion in the wiring board from molten solder during flow soldering.

PTL 1 discloses a solder shielding wiring board cover which is freely detachable and repeatedly usable.

However, a conventional wiring board cover is fixed to an outer peripheral edge of a wiring board, and so shaped as to cover only a portion desired to be shielded from molten solder. The wiring board cover therefore has such a shape associated with a type of the circuit board with one-to-one correspondence. Accordingly, in manufacturing a different type of circuit board, a wiring board cover corresponding to the different type of circuit board needs to be newly manufactured. This necessity lowers productivity of circuit boards including manufacture of wiring board covers, thereby raising manufacturing costs.

In addition, a conventional wiring board cover needs to hold a portion covered and shielded from molten solder (cover portion) with respect to an outer peripheral edge of a wiring board. Accordingly, a thin rib-shaped beam member connecting the outer peripheral edge and the cover portion needs to be disposed on the wiring board. Thus, in the wiring board, soldering cannot be performed in a portion where the beam member is disposed. According to the conventional wiring board cover, therefore, a component is disposed on a circuit board at positions limited by the shape of the wiring board cover.

CITATION LIST

Patent Literature

PTL 1: Unexamined Japanese Patent Publication No. 2000-349428

SUMMARY

The present disclosure provides a cover member having versatility, a circuit board to which the cover member is attachable, and a method for manufacturing the circuit board.

The method for manufacturing the circuit board according to the present disclosure is a method for manufacturing a circuit board that includes a wiring board that has a hole in which a body portion of a component is disposed in an inserted state. According to the method, either a first claw or a second claw is inserted through a notch formed by notching an edge of the hole. The first claw and the second claw are provided on a wall portion of a cover member that covers the body portion from a soldering surface side, the first claw and the second claw projecting outward from the wall portion. The cover member is held on the wiring board, by sliding the cover member relative to the wiring board in a direction along a component mounting surface of the wiring board to position the edge of the hole between the first claw and the second claw provided on a surface of the wall portion identical to a surface on which the first claw is provided. The body portion is inserted into the hole, and an electrode terminal of the body portion is disposed on the wiring board. Solder is applied, by flow soldering, to the wiring board on which the cover member is held. The cover member is detached from the wiring board, by sliding the cover member relative to the wiring board to which solder has been applied to shift the first claw from the component mounting surface side to the soldering surface side with the first claw passing through the notch.

In addition, the circuit board according to the present disclosure is a circuit board that includes a wiring board, and a component that includes a body portion on which an electrode terminal connected to wiring is provided. The wiring board includes: a hole in which the body portion of the component is disposed in an inserted state; a solder connection portion that connects, by solder, the electrode terminal of the component with wiring provided on a soldering surface side of the wiring board; and a notch formed by notching a part of each of facing edges included in edges of the hole.

In addition, the cover member according to the present disclosure is a cover member that covers, from a soldering surface side, a component disposed in a state that a body portion of the component is inserted into a hole formed in a wiring board when solder is applied by flow soldering. The cover member includes: a cover body that has a plate shape and covers the component; two wall portions provided on the cover body and facing each other in a raised state; a first claw provided on the wall portion and projecting outward from the wall portion; and a second claw provided on a surface of the wall portion identical to a surface on which the first claw is provided, the second claw being disposed at a position closer to the cover body than a position at whic the first claw is disposed in such a manner that a distance between the second claw and the first claw is approximately equivalent to a thickness of the wiring board.

According to the present disclosure, an identical cover member can be used for different types of circuit boards. Accordingly, reduction of manufacturing costs of a circuit board is achievable. Moreover, a necessity of using a beam member which connects a peripheral edge of a wiring board and a shielded portion is eliminated. Accordingly, a degree of freedom of layout of a circuit board increases.

DESCRIPTION OF EMBODIMENTS

With reference to the drawings as appropriate, a description is given of a method for manufacturing a circuit board, a circuit board, and a cover member according to exemplary embodiments of the present disclosure. However, detailed descriptions that are more than necessary may be omitted. For example, detailed descriptions of already well-known matters, or duplicated descriptions of substantially identical configurations may be omitted. Such omissions are made for avoiding excessive redundancy of following description, and for helping those skilled in the art easily understand the following description.

Noted that the accompanying drawings and the following description are presented to help those skilled in the art fully understand the present disclosure, and are not intended to limit the subject matters as claimed in the claims. In addition, the method for manufacturing the circuit board, the circuit board, and the cover member according to the present disclosure described in the following exemplary embodiments are presented by way of example. Accordingly, the scope of the present disclosure is defined by the recitations of the claims claimed with reference to the following exemplary embodiments, and should not be limited only to the following exemplary embodiments. As such, among constituent elements in the following exemplary embodiments, constituent elements not recited in the independent claim that indicates the most generic concept of the present disclosure are not necessarily essential for achievement of the object of the present disclosure, but are described for preferred embodiments.

The drawings are not necessarily exact illustrations, but schematic views in which emphasis, omission, and proportion adjustment are made as required for clear illustration of the present disclosure. Accordingly, these drawings may have shapes, positional relationships, and proportions that differ from actual shapes, actual positional relationships, and actual proportions. In the respective drawings, substantially identical constituent elements are given identical reference marks. Descriptions of those constituent elements may be omitted or simplified.

Exemplary embodiments of the present disclosure are hereinafter described with reference to FIGS. 1 to 12. In the following exemplary embodiments, each of the drawings shows three axes of X axis, Y axis, and Z axis. The X axis refers to a direction parallel to one side of a circuit board, the Y axis refers to a direction parallel to another side orthogonal to the one side of the circuit board, and the Z axis refers to a direction orthogonal to both of the X axis and the Y axis, i.e., a direction perpendicular to a soldering surface or a component mounting surface of the circuit board. However, these axes and directions are shown only for convenience, and do not limit the present disclosure in any way.

First Exemplary Embodiment

[1-1. Configuration]

Figure 1:
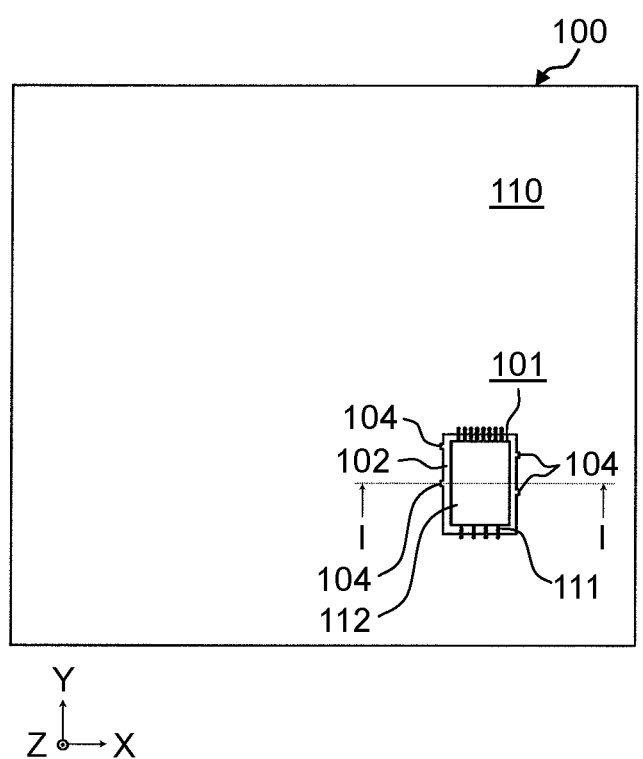
FIG. 1 is a plan view schematically illustrating an example of a component mounting surface side of a circuit board according to a first exemplary embodiment.

FIG. 1 is a plan view schematically illustrating an example of a component 101 mounting surface side of circuit board 100 according to a first exemplary embodiment.

Figure 2:
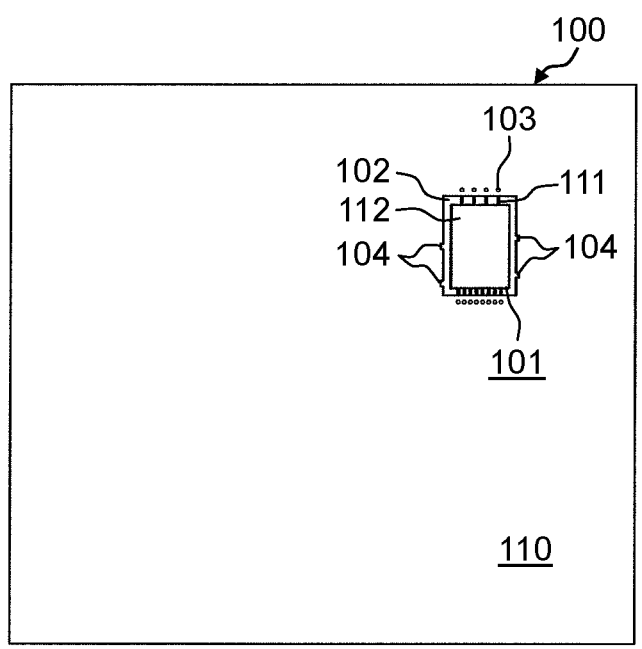
FIG. 2 is a plan view schematically illustrating an example of a soldering surface side of the circuit board according to the first exemplary embodiment.
Figure 2:
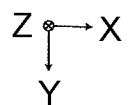

FIG. 2 is a plan view schematically illustrating an example of a soldering surface side of circuit board 100 according to the first exemplary embodiment.

Note that a wiring pattern is provided on a predetermined surface of circuit board 100, and that a plurality of components are mounted on circuit board 100. However, each of the drawings only shows component 101 as a typical example of the plurality of components, and does not show the other components and the wiring pattern.

Circuit board 100 includes wiring board 110 and component 101. Circuit board 100 includes wiring board 110 and a plurality of components, such as electronic components and electric components, including component 101 and being mounted on wiring board 110. Circuit board 100 is a device which implements a unit of electric or electronic circuits, such as a power supply circuit and a control circuit.

Figure 3:
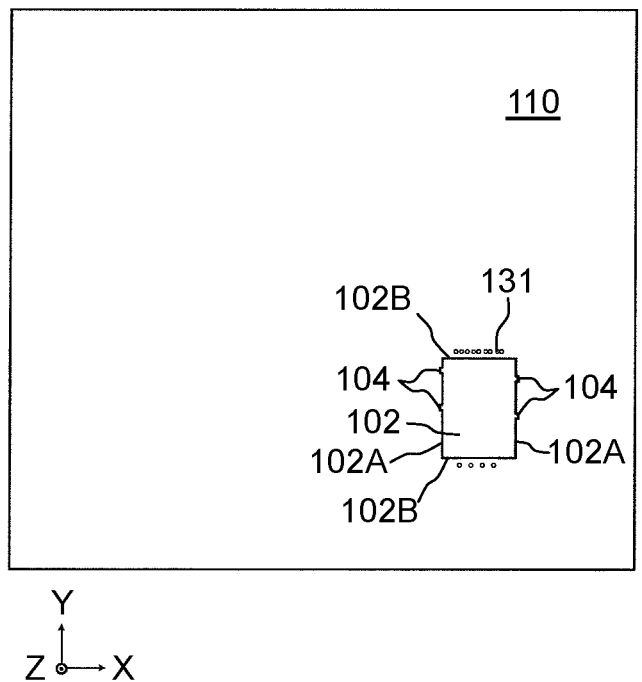
FIG. 3 is a plan view schematically illustrating an example of a component mounting surface side of a wiring board according to the first exemplary embodiment.

FIG. 3 is a plan view schematically illustrating an example of the component 101 mounting surface side of wiring board 110 according to the first exemplary embodiment.

Wiring board 110 is a plate-shaped member made of an insulator material. Wiring board 110 includes a wire pattern made of metal or the like and provided on a predetermined surface of wiring board 110, and is generally called "printed wiring board", for example.

Wiring board 110 includes hole 102 and notches 104.

Hole 102 is formed at a predetermined position of wiring board 110 in a penetrating state. Hole 102 is a portion surrounded by a body of wiring board 110 at least in three directions, and is a space where body portion 112 of component 101 is disposed in an inserted state into hole 102. Hole 102 has edges 102A and 102B surrounding hole 102. Among edges 102A and 102B, each of two facing edges 102A has notches 104.

According to a configuration example described in the present exemplary embodiment, hole 102 is a rectangular space surrounded by the body of wiring board 110 in four directions. In this case, two edges 102A each extending substantially parallel with the Y axis and having notches 104 extend substantially parallel with each other and face each other.

Each of notches 104 is formed in a part of corresponding edge 102A of hole 102. Each of notches 104 is an area notched in a part of corresponding edge 102A of hole 102 in a direction away from hole 102. Each of notches 104 is not required to have a specifically limited shape, but has at least such a shape and a size allowing insertion of first claw 211 of cover member 200 described below. Note that each of notches 104 according to the present exemplary embodiment has such a shape and a size allowing insertion of both first claw 211 and second claw 212. However, each of notches 104 or second claws 212 may be so formed that second claw 212 does not pass through notch 104. This configuration will be described in other exemplary embodiments described below.

According to the configuration example of the present exemplary embodiment, each of first claws 211 and second claws 212 has a rectangular shape in a plan view (as viewed in Z axis direction). Accordingly, each of notches 104 similarly has a rectangular shape in a plan view (as viewed in Z axis direction).

In addition, two notches 104 are formed in each of two facing edges 102A of hole 102. In this case, respective notches 104 are provided such that a distance between two notches 104 formed in one edge 102A is substantially equivalent to a distance between two notches 104 formed in other edge 102A.

Furthermore, notches 104 formed in one edge 102A are disposed at positions shifted from notches 104 formed in other edge 102A (positions shifted in Y axis direction). That is, notches 104 in one edge 102A and notches 104 in other edge 102A are disposed at positions not facing each other in the X axis direction. In other words, notches 104 in one edge 102A and notches 104 in other edge 102A are asymmetrically disposed with respect to a center axis parallel with edges 102A having notches 104 (axis parallel with Y axis and passing through center of hole 102).

Note that attachment stability of cover member 200 to wiring board 110 can increase when the distance between two notches 104 formed in each of one edge 102A and other edge 102A is not excessively reduced (i.e., certain clearance is left). In this manner, cover member 200 is not easily separated from wiring board 110 during soldering.

In addition, wiring board 110 has a plurality of attachment holes 131 through which electrode terminals of components are respectively inserted. Each of attachment holes 131 is a hole smaller than hole 102. A land is provided at a peripheral edge of each attachment hole 131 on the soldering surface side of wiring board 110. The land is an area to which solder is applied to connect wiring with the electrode terminal. The land corresponds to solder connection portion 103.

An area of wiring of wiring board 110 other than a portion to which solder is applied, such as the land, is covered with a resist.

Component 101 includes body portion 112, and electrode terminals 111 provided outside body portion 112 (see FIGS. 1 and 2). Component 101 is mounted on wiring board 110 to constitute an electronic circuit or an electric circuit. A plurality of types of components 101 are mounted on circuit board 100. However, among these types of components 101, component 101 relatively large and disposed in a state penetrating hole 102 of wiring board 110 is described in the present exemplary embodiment.

Figure 4:
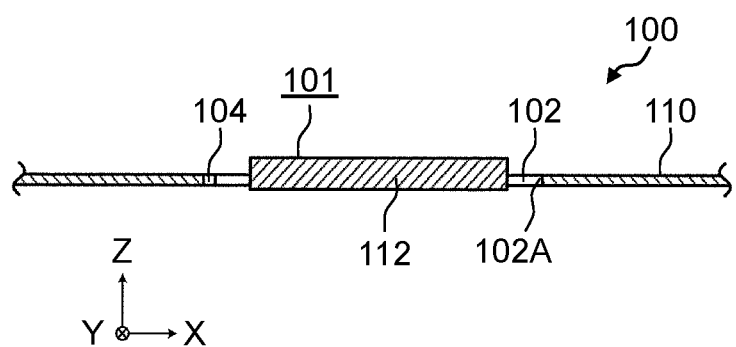
FIG. 4 is a cross-sectional view taken along line I-I in FIG. 1.

FIG. 4 is a cross-sectional view taken along line I-I in FIG. 1.

Component 101 is a component relatively large-sized (with large thickness), such as a power transistor including a transformer, a coil, and a heat sink. When component 101 thus large-sized is mounted on a surface of wiring board 110, component 101 projects more than other components, thereby increasing an entire thickness of circuit board 100. According to the present exemplary embodiment, however, component 101 is disposed on wiring board 110 in a state that body portion 112 of component 101 is inserted into hole 102 formed in wiring board 110. In this manner, a height of component 101 projecting to one side of wiring board 110 is reduced to a relatively small height as illustrated in FIG. 4 by way of example. Accordingly, reduction of the thickness of circuit board 100 is achievable.

However, body portion 112 of component 101 in this state is exposed to the soldering surface side of wiring board 110 from hole 102. During soldering, therefore, body portion 112 thus exposed needs to be covered by a cover provided for shielding from solder.

Each of solder connection portions 103 (see FIG. 2) is a land provided on the peripheral edge of attachment hole 131 formed on the soldering surface side of wiring board 110, and corresponds to a portion to which solder is applied by flow soldering. Each of electrode terminals 111 inserted through attachment hole 131 of component 101 is electrically connected to solder connection portion 103 by solder.

Figure 5:
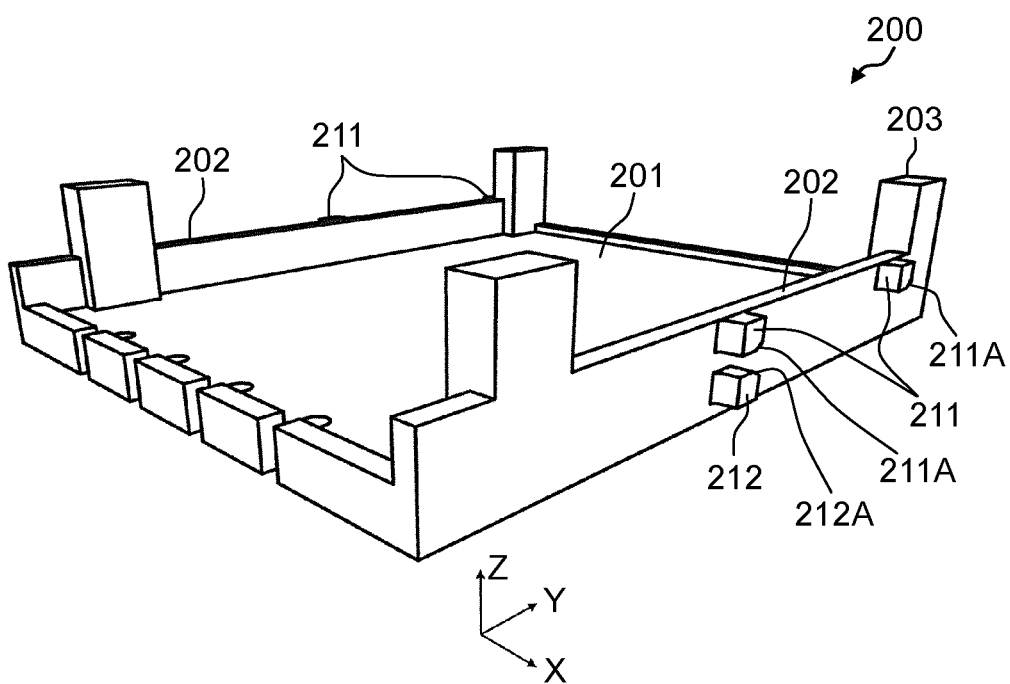
FIG. 5 is a perspective view schematically illustrating a cover member according to the first exemplary embodiment.

FIG. 5 is a perspective view schematically illustrating cover member 200 according to the first exemplary embodiment. FIG. 5 is a perspective view of cover member 200 as viewed from one wall portion side.

Figure 6:
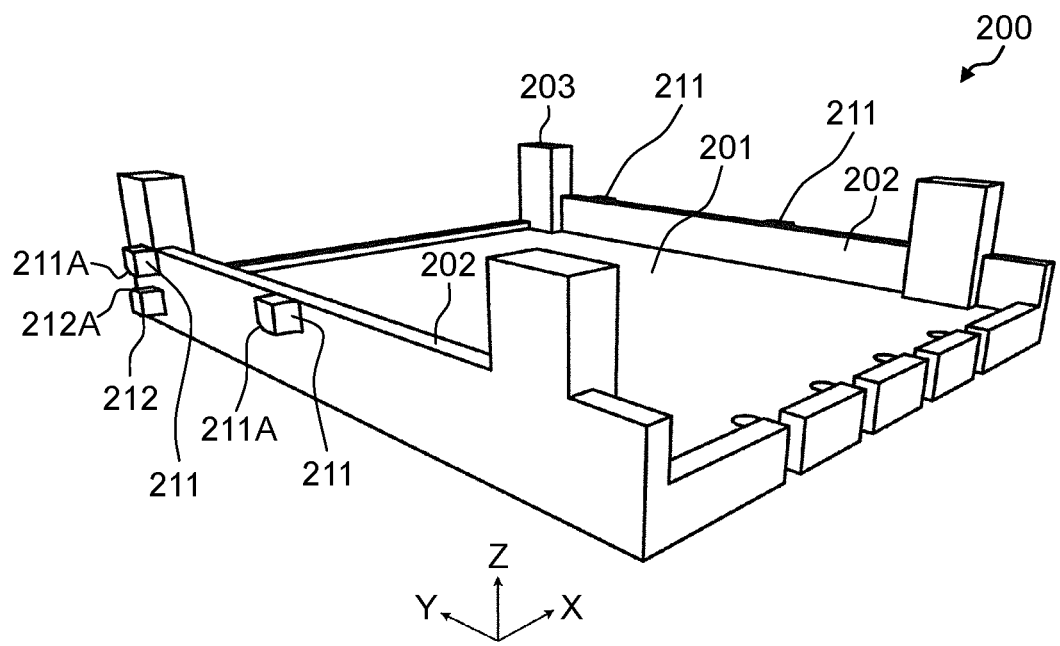
FIG. 6 is a perspective view schematically illustrating the cover member according to the first exemplary embodiment.

FIG. 6 is a perspective view schematically illustrating cover member 200 according to the first exemplary embodiment. FIG. 6 is a perspective view of cover member 200 as viewed from the other wall portion side.

Cover member 200 is a member which covers, from the soldering surface side, component 101 disposed on wiring board 110 in a state that body portion 112 of component 101 is inserted into hole 102 formed in wiring board 110 when solder is applied to wiring board 110 by flow soldering. As illustrated in FIGS. 5 and 6, cover member 200 includes cover body 201, wall portions 202, first claws 211, and second claws 212. According to the configuration example illustrated in the present exemplary embodiment, cover member 200 further includes handles 203.

Cover member 200 is not required to be made of particularly limited material. However, preferably the material for cover member 200 has a tolerance to a temperature of molten solder, and has rigidity sufficient for resisting pressure of injected molten solder without deformation. According to the configuration example of the present exemplary embodiment, cover member 200 is made of resin. In addition, cover member 200 includes cover body 201, wall portions 202, first claws 211, second claws 212, and handles 203 formed integrally with each other.

Cover body 201 is a plate-shaped part which covers, from the soldering surface side, entire body portion 112 of component 101 disposed in an inserted state into hole 102 of wiring board 110. Cover body 201 protects component 101 such that molten solder in an injected state does not come into contact with body portion 112.

Cover body 201 is not required to have a particularly limited shape. Cover body 201 may have any shapes as long as cover body 201 can be inserted into hole 102 of wiring board 110, and can protect component 101 from molten solder. Cover body 201 may include two edges extending in parallel with each other.

Wall portions 202 are portions provided on cover member 200 at two positions facing each other in a state raised from cover body 201. Wall portions 202 extend in the Z axis positive direction (i.e., a direction from the soldering surface toward the component mounting surface when cover member 200 is attached to wiring board 110) from cover body 201. According to the configuration example described in the present exemplary embodiment, respective wall portions 202 are disposed on cover member 200 in such positions as to extend substantially in parallel with two edges of cover body 201 extending parallel with each other. Two wall portions 202 are disposed on cover member 200 in such positions that a clearance between wall portions 202 is sufficient for contact with two parallel edges 102A of hole 102 of wiring board 110 from the inside of wall portions 202, or sufficient for producing a slight space between wall portions 202 and edges 102A. In addition, wall portions 202 are disposed on cover member 200 in such a condition as to be slidable from the inside of hole 102 along edges 102A of hole 102.

Each of first claws 211 is a projection portion provided on an outer surface of corresponding wall portion 202 and projecting outward from the surface. As described below, first claws 211 are provided to position edges 102A of hole 102 of wiring board 110 between first claws 211 and second claws 212. Each of first claws 211 has such a shape as to pass through corresponding notch 104 of wiring board 110. In addition, first claws 211 are disposed farther away from cover body 201 in the Z axis direction than second claws 212 are. Each of first claws 211 is not required to have a particularly limited shape. Each of first claws 211 may have any shapes as long as first claw 211 can be accommodated inside notch 104 (i.e., first claw 211 can pass through notch 104) in a plan view (as viewed in Z axis direction). According to the configuration example described in the present exemplary embodiment, each of notches 104 has a rectangular shape in a plan view (as viewed in Z axis direction). Accordingly, each of first claws 211 also has a substantially rectangular shape in a plan view. Moreover, each of first claws 211 has a substantially rectangular shape also in a side view (as viewed in X axis direction or Y axis direction). Accordingly, each of first claws 211 of the present exemplary embodiment has a substantially rectangular parallelepiped shape.

In addition, each of first claws 211 may have tapered portion 211A for facilitating positioning of edge 102A of hole 102 between first claw 211 and second claw 212 at the time of attachment of cover member 200 to wiring board 110. For example, each of tapered portions 211A is provided on first claw 211 near an area initially coming into contact with edge 102A at the time of positioning of edge 102A between first claw 211 and second claw 212, and is formed such that a clearance between first claw 211 and second claw 212 in the Z axis direction gradually increases in an extension direction of wall portion 202 (Y axis positive direction). Furthermore, first claw 211 not paired with second claw 212 may have tapered portion 211A similar to the foregoing tapered portion. In this case, the portion of first claw 211 initially coming into contact with edge 102A is not caught by edge 102A at the time of attachment of cover member 200 to wiring board 110.

Each position of first claws 211 is not particularly limited. Each of first claws 211 may be provided at any position of each of two wall portions 202 as long as the position is associated with the position of corresponding notch 104. According to the configuration example described in the present exemplary embodiment, two notches 104 are formed in each of two edges 102A. Two first claws 211 are disposed on each of two wall portions 202 in correspondence with notches 104.

Note that a distance between two first claws 211 disposed on one wall portion 202 is substantially equivalent to the distance between two notches 104 associated with corresponding first claws 211. Furthermore, notches 104 formed in one edge 102A are disposed at positions not facing notches 104 formed in other edge 102A (positions shifted from each other) as described above. In correspondence with this arrangement, first claws 211 provided on one and other wall portions 202 facing each other are similarly disposed at positions not facing each other (positions shifted from each other).

Each of second claws 212 is a projection portion provided on an outer surface of wall portion 202 and projecting outward, similarly to first claws 211. In addition, each of second claws 212 is provided to position edge 102A of hole 102 of wiring board 110 between first claw 211 and second claw 212. Each of second claws 212 is disposed on a surface identical to the surface on which first claw 211 is disposed, and positioned closer to cover body 201 in the Z axis direction than first claw 211 is, at such position that a distance between first claw 211 and second claw 212 in the Z axis direction is approximately equivalent to a thickness of wiring board 110. According to the present exemplary embodiment, cover member 200 can be detachably fixed to wiring board 110 by positioning wiring board 110 between first claws 211 and second claws 212.

Each of second claws 212 is not required to have a particularly limited shape. According to the configuration example described in the present exemplary embodiment, however, cover member 200 is inserted into hole 102 from the side of the component 101 mounting surface of wiring board 110 (Z axis positive side surface). Accordingly, each of second claws 212 of the present exemplary embodiment has a rectangular parallelepiped shape similar to each shape of first claws 211 to pass through notch 104.

In addition, similarly to first claws 211, each of second claws 212 may have tapered portion 212A for facilitating positioning of edge 102A of hole 102 of wiring board 110 between first claw 211 and second claw 212 at the time of attachment of cover member 200 to wiring board 110. For example, tapered portion 212A is provided on second claw 212 near an area initially coming into contact with edge 102A at the time of positioning of edge 102A between first claw 211 and second claw 212, and is formed such that the clearance between first claw 211 and second claw 212 in the Z axis direction gradually increases in the extension direction of wall portion 202 (Y axis positive direction).

Each position of second claws 212 is not particularly limited. However, in case of such a configuration that second claw 212 passes through notch 104 as in the present exemplary embodiment, each position of second claws 212 is required to be a position associated with corresponding notch 104, similarly to first claws 211. Moreover, according to the configuration example described in the present exemplary embodiment, one second claw 212 is provided at each of positions associated with two first claws 211 disposed at diagonal positions in the four positions of first claws 211. However, second claws 212 are not provided at the other diagonal positions. In the arrangement that second claws 212 are disposed at diagonal positions as in the configuration example described in the present exemplary embodiment, lowering of holding force of cover member 200 with respect to wiring board 110 is avoidable. In addition, according to the arrangement that second claws 212 are not disposed at the other diagonal positions, only two second claws 212 need to pass through notches 104 at the time of insertion of cover member 200 into hole 102 from the side of the component 101 mounting surface of wiring board 110 (Z axis positive side surface). Accordingly, in comparison with a configuration which inserts four second claws 212 into notches 104, attachability (attachment easiness) of cover member 200 can improve.

Each of handles 203 is a portion disposed near a corner of cover body 201 in such a shape as to project more than first claws 211 toward the Z axis positive side. Handles 203 are provided to facilitate handling of cover member 200, which is attached to wiring board 110 from the side of the soldering surface (Z axis negative side surface), such that cover member 200 can be easily handled from the side of the component 101 mounting surface (Z axis positive side surface) opposite to the soldering surface.

According to the configuration example described in the present exemplary embodiment, handles 203 each have a rectangular pillar shape, and are provided at four corners (or near four corners) of cover body 201. Among four handles 203, handles 203 disposed at leading ends in a sliding direction of cover member 200 (Y axis positive direction) during attachment of cover member 200 to wiring board 110 come into contact with edges 102B not provided with notches 104 of hole 102 to perform a function of determining a position of cover member 200 with respect to wiring board 110.

[1-2. Method for Manufacturing Circuit Board]

A method for manufacturing circuit board 100 will now be described. This method attaches cover member 200 to wiring board 110 before disposing body portion 112 of component 101 in hole 102 formed in wiring board 110, and subsequently disposes component 101 on wiring board 110 in this condition. Description will be given below of an example in which cover member 200 is attached to wiring board 110 from the side of the component 101 mounting surface of wiring board 110 (Z axis positive side surface).

FIGS. 7 to 11 are perspective views each illustrating the method for manufacturing the circuit board according to the first exemplary embodiment. FIGS. 7 to 11 sequentially show the method for manufacturing the circuit board according to the first exemplary embodiment.

Figure 7:
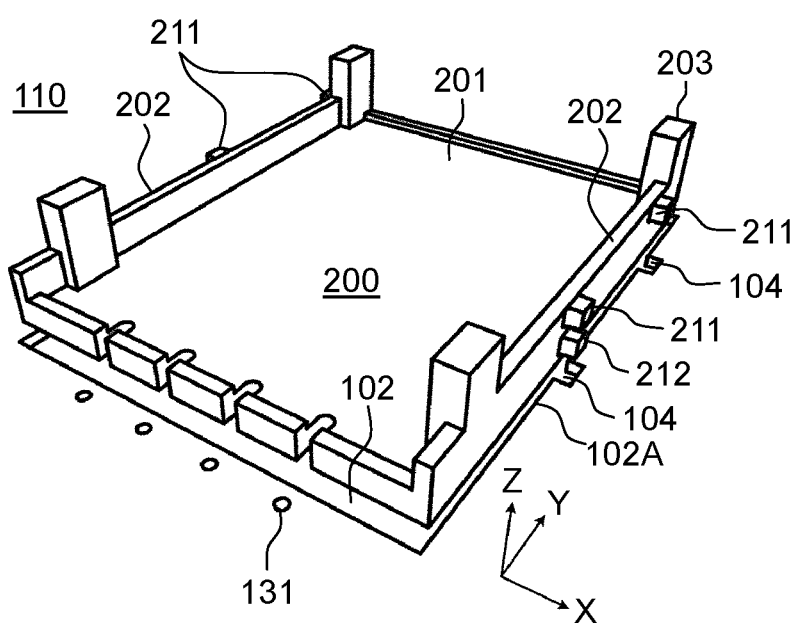
FIG. 7 is a perspective view illustrating a method for manufacturing the circuit board according to the first exemplary embodiment.

Initially, as illustrated in FIG. 7, cover member 200 is disposed such that respective positions of second claws 212 provided on wall portions 202 of cover member 200 come to positions associated with respective positions of notches 104 formed in edges 102A of hole 102 of wiring board 110.

Figure 8:
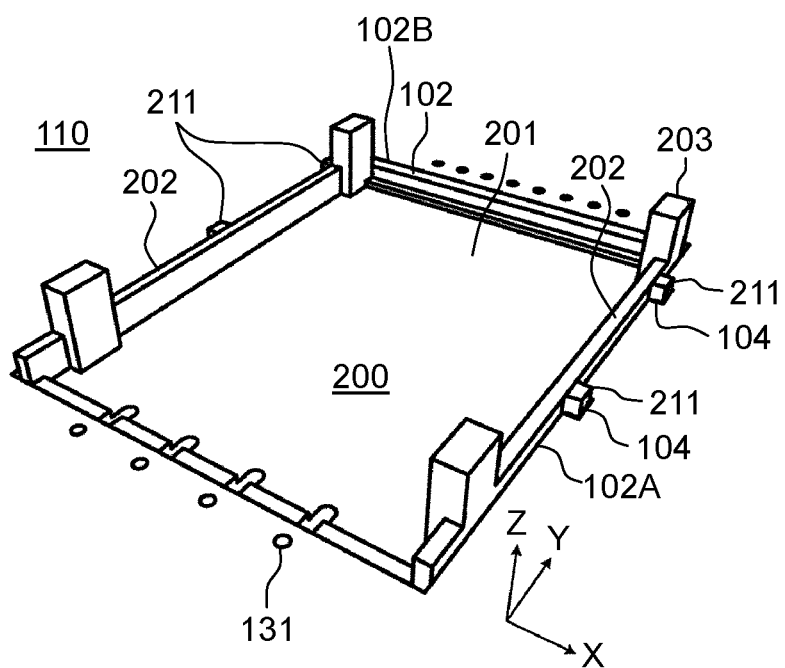
FIG. 8 is a perspective view illustrating the method for manufacturing the circuit board according to the first exemplary embodiment.

Subsequently, as illustrated in FIG. 8, second claws 212 are inserted into notches 104, and cover member 200 is shifted in the Z axis negative direction to such a position that wiring board 110 comes to be positioned between first claws 211 and second claws 212 to insert cover member 200 into hole 102.

Figure 9:
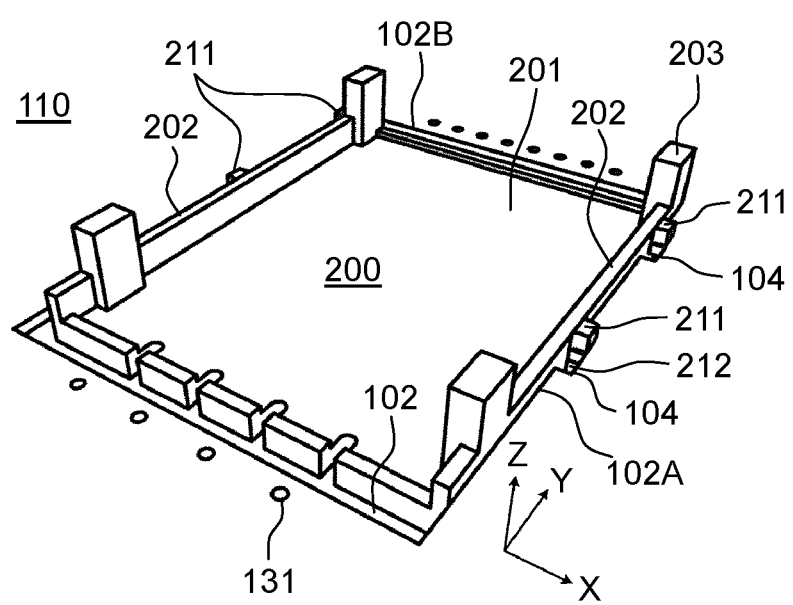
FIG. 9 is a perspective view illustrating the method for manufacturing the circuit board according to the first exemplary embodiment.

Subsequently, as illustrated in FIG. 9, cover member 200 is slid relative to wiring board 110 in a direction along the component 101 mounting surface of wiring board 110 and in a direction for sliding wall portions 202 in contact with two parallel edges 102A of hole 102 from the inside (in Y axis positive direction). At this time, cover member 200 is slid until handles 203 come into contact with edges 102B of hole 102 as illustrated in FIG. 9.

By the foregoing procedures, edges 102A of hole 102 can come to be positioned between first claws 211 and second claws 212. As a result, cover member 200 is held on wiring board 110.

Figure 10:
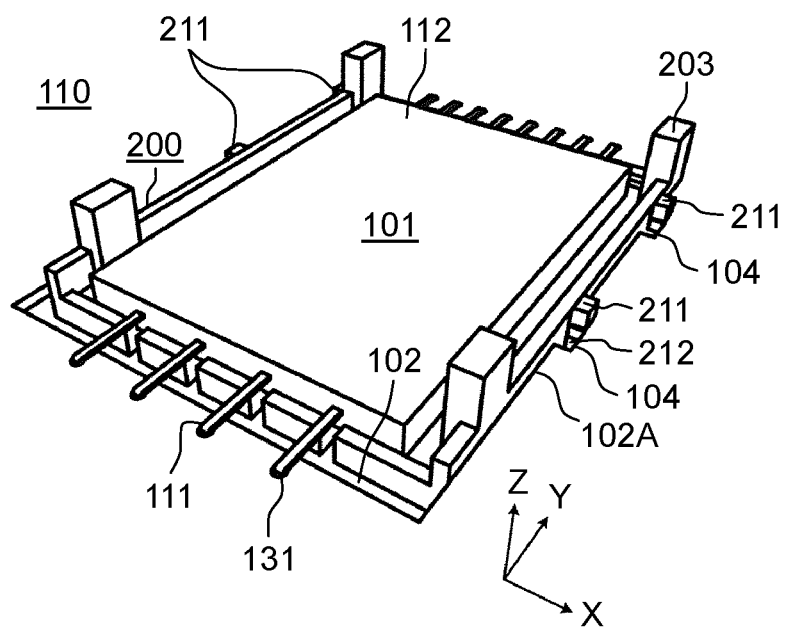
FIG. 10 is a perspective view illustrating the method for manufacturing the circuit board according to the first exemplary embodiment.

Subsequently, as illustrated in FIG. 10, body portion 112 of component 101 is disposed in hole 102 to be accommodated within cover member 200 disposed in hole 102. Electrode terminals 111 are inserted through attachment holes 131 of wiring board 110.

Subsequently, solder is applied to the soldering surface (Z axis negative side surface) of wiring board 110 by flow soldering which presses the soldering surface of wiring board 110 against injected molten solder in a state that cover member 200 is fixed to and held on wiring board 110. Component 101 is mounted on wiring board 110 in an exposed state from hole 102 toward the soldering surface side. According to the present exemplary embodiment, however, component 101 is protected from molten solder by cover member 200. Accordingly, direct adhesion of molten solder to component 101 is prevented during application of molten solder to the soldering surface. On the other hand, molten solder is applied to electrode terminals 111 projecting from attachment holes 131 toward the soldering surface side (Z axis negative direction), and solder connection portions 103 provided on the peripheral edges of attachment holes 131 to electrically connect electrode terminals 111 with solder connection portions 103.

Note that pressure in the Z axis positive direction from the soldering surface side may be applied to cover member 200 by injected molten solder when molten solder is applied to the soldering surface of wiring board 110 by flow soldering. According to the present exemplary embodiment, however, force resisting this pressure is generated by contact between second claws 212 and edges 102A of hole 102. Accordingly, a rise of cover member 200 from wiring board 110 (shift in Z axis positive direction) caused by the pressure is preventable.

Figure 11:
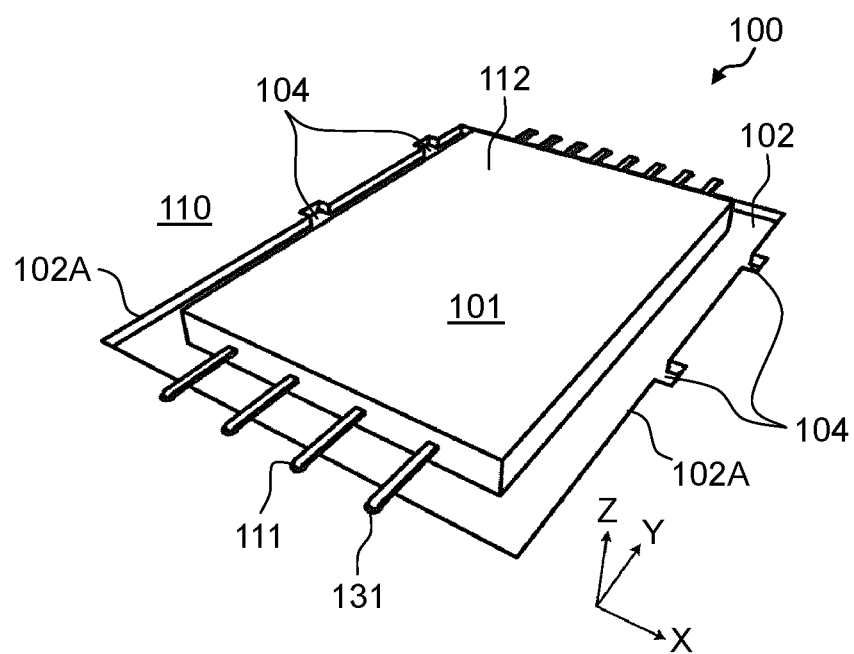
FIG. 11 is a perspective view illustrating the method for manufacturing the circuit board according to the first exemplary embodiment.

Subsequently, cover member 200 is slid in the direction opposite to the foregoing direction relative to wiring board 110 to which solder has been applied. Thereafter, cover member 200 is shifted in the Z axis negative direction to allow first claws 211 to pass through notches 104 and pull first claws 211 out toward the soldering surface side. In this manner, cover member 200 is detachable from wiring board 110 as illustrated in FIG. 11.

Accordingly, component 101 is protected from molten solder during manufacture of circuit board 100.

[1-3. Effects and Others]

As described above, the method for manufacturing the circuit board according to the present exemplary embodiment is a method for manufacturing a circuit board including a wiring board that has a hole in which a body portion of a component is disposed in an inserted state. According to this method, either a first claw or a second claw is inserted through a notch formed by notching an edge of the hole. The first claw and the second claw are provided on a wall portion of a cover member that covers the body portion of the component from a soldering surface side, the first claw and the second claw projecting outward from the wall portion. Then, the cover member is held on the wiring board, by sliding the cover member relative to the wiring board in a direction along a component mounting surface of the wiring board to position the edge of the hole between the first claw and the second claw provided on a surface of the wall portion identical to a surface on which the first claw is provided. Then, the body portion is inserted into the hole, and an electrode terminal of the body portion is disposed on the wiring board. Then, solder is applied by flow soldering to the wiring board on which the cover member is held. Then, the cover member is detached from the wiring board, by sliding the cover member relative to the wiring board to which solder has been applied to shift the first claw from the component mounting surface side to the soldering surface side with the first claw passing through the notch.

According to the present exemplary embodiment, a circuit board includes a wiring board, and a component that includes a body portion on which an electrode terminal connected to wiring is provided. The wiring board includes: a hole in which the body portion of the component is disposed in an inserted state; a solder connection portion that connects, by solder, the electrode terminal of the component with wiring provided on a soldering surface side of the wiring board; and a notch formed by notching a part of each of facing edges included in edges of the hole.

According to the present exemplary embodiment, a cover member is a cover member that covers, from a soldering surface side, a component disposed in a state that a body portion of the component is inserted into a hole formed in a wiring board when solder is applied to the wiring board by flow soldering. The cover member includes: a cover body that has a plate shape and covers the component; two wall portions provided on the cover body and facing each other in a raised state; a first claw provided on the wall portion and projecting outward from the wall portion; and a second claw provided on a surface of the wall portion identical to a surface on which the first claw is provided, the second claw being disposed at a position closer to the cover body than a position at which the first claw is disposed in such a manner that a distance between the second claw and the first claw is approximately equivalent to a thickness of the wiring board.

The cover member may further include a handle disposed at a corner of the cover body and projecting more than the first claw.

Note that circuit board 100 is an example of the circuit board. Wiring board 110 is an example of the wiring board. Hole 102 is an example of the hole formed in the wiring board. Component 101 is an example of the component. Body portion 112 is an example of the body portion of the component. Cover member 200 is an example of the cover member. Wall portion 202 is an example of the wall portion of the cover member. First claw 211 is an example of the first claw. Second claw 212 is an example of the second claw. Notch 104 is an example of the notch. Electrode terminal 111 is an example of the electrode terminal. Solder connection portion 103 is an example of the solder connection portion. Cover body 201 is an example of the cover body. Handle 203 is an example of the handle. Edge 102A is an example of the edge which has the notch.

For example, in the example described in the first exemplary embodiment, according to the method for manufacturing circuit board 100 that includes wiring board 110 that has hole 102 in which body portion 112 of component 101 is disposed in an inserted state, either first claw 211 or second claw 212 is inserted through notch 104 formed by notching edge 102A of hole 102. First claw 211 and second claw 212 are provided on wall portion 202 of cover member 200 that covers body portion 112 of component 101 from a soldering surface side, first claw 211 and second claw 212 projecting outward from wall portion 202. Then, cover member 200 is held on wiring board 110 by sliding cover member 200 relative to wiring board 110 in a direction along a component 101 mounting surface of wiring board 110 to position edge 102A of hole 102 between first claw 211 and second claw 212 provided on a surface of wall portion 202 identical to a surface on which first claw 211 is provided. Then, body portion 112 is inserted into hole 102, and electrode terminal 111 of body portion 112 is disposed on wiring board 110. Then, solder is applied by flow soldering to wiring board 110 on which cover member 200 is held. Then, cover member 200 is detached from wiring board 110, by sliding cover member 200 relative to wiring board 110 to which solder has been applied to shift first claw 211 from the component mounting surface side to the soldering surface side with first claw 211 passing through notch 104.

According to the example described in the first exemplary embodiment, circuit board 100 includes wiring board 110, and component 101 that includes body portion 112 on which electrode terminal 111 connected to wiring is provided. Wiring board 110 includes: hole 102 in which body portion 112 of component 101 is disposed in an inserted state; solder connection portion 103 that connects, by solder, electrode terminal 111 of component 101 with wiring provided on a soldering surface side of wiring board 110; and notches 104 respectively formed by notching a part of facing edges 102A included in edges 102A and 102B of hole 102.

According to the example described in the first exemplary embodiment, cover member 200 is a cover member that covers, from a soldering surface side, component 101 disposed in a state that body portion 112 of component 101 is inserted into hole 102 formed in wiring board 110 when solder is applied to wiring board 110 by flow soldering. Cover member 200 includes: cover body 201 that has a plate shape and covers component 101; two wall portions 202 provided on cover body 201 and facing each other in a raised state; first claw 211 provided on wall portion 202 and projecting outward from wall portion 202; and second claw 212 provided on a surface of wall portion 202 identical to a surface on which first claw 211 is provided. Second claw 212 is disposed at a position closer to cover body 201 than a position at which first claw 211 is disposed in such a manner that a distance between second claw 212 and first claw 211 is approximately equivalent to a thickness of wiring board 110.

According to the example described in the first exemplary embodiment, cover member 200 further includes handle 203 disposed at a corner of cover body 201 and projecting more than first claw 211.

According to the method for manufacturing circuit board 100 as described in the present exemplary embodiment, and circuit board 100 which includes wiring board 110, and cover member 200 for each of which the manufacturing method described in the present exemplary embodiment can be performed, soldering by flow soldering is allowed to be carried out in a state that only body portion 112 of component 101 disposed in wiring board 110 in a penetrating state is covered. Accordingly, even for circuit boards 100 having different configurations, identical cover member 200 can be used during soldering by flow soldering when component 101 having an identical shape is used for each of circuit boards 100.

More specifically, according to the present exemplary embodiment, a necessity of manufacturing new cover member 200 for circuit board 100 having a new configuration is eliminated (even in case of thickness change of component 101) unless the shape of component 101 to be used (shape in plan view) changes. In this case, a manufacturing step of circuit board 100 including manufacture of cover member 200 can be simplified. Accordingly, entire productivity of circuit board 100 can increase.

Moreover, use versatility of cover member 200 improves, wherefore reduction of manufacturing costs of circuit board 100 is achievable.

In addition, in the step for applying solder to wiring board 110, cover member 200 is difficult to attach to wiring board 110 from the soldering surface side in a state that equipment for applying molten solder is provided on the soldering surface side of wiring board 110. According to the present exemplary embodiment, however, cover member 200 can be attached to wiring board 110 from the side of the component 101 mounting surface of wiring board 110 (Z axis positive side surface) as described above. Accordingly, attachment work of cover member 200 is facilitated.

Note that attachment of cover member 200 to wiring board 110 is allowed either from the soldering surface side or from the component mounting surface side before component 101 is mounted on wiring board 110. However, for detaching cover member 200 from wiring board 110 after component 101 is soldered to wiring board 110, cover member 200 is only allowed to be detached from the soldering surface side. Specifically, a shift direction of cover member 200 for detachment of cover member 200 from wiring board 110 is fixed to one direction (Z axis negative direction) at any time. Accordingly, for equalizing the shift direction of cover member 200 for attaching cover member 200 to wiring board 110 with the shift direction of cover member 200 for detaching cover member 200 from wiring board 110 (i.e., for attaching cover member 200 to wiring board 110 from the component mounting surface side and detaching cover member 200 from the soldering surface side), both first claws 211 and second claws 212 need to be so formed as to pass through notches 104. Note that, description will be given below of a configuration for changing the shift direction of cover member 200 between attachment of cover member 200 to wiring board 110 and detachment of cover member 200 from wiring board 110 (i.e., for attaching cover member 200 to wiring board 110 from the soldering surface side and detaching cover member 200 from the soldering surface side).

Other Exemplary Embodiments

The first exemplary embodiment has been described above as an example of the technology disclosed in the present application. However, the present disclosure is not limited to the exemplary embodiment described herein. The technology of the present disclosure is also applicable to exemplary embodiments that include changes, replacements, additions, or omissions, for example. For example, new exemplary embodiments can be practiced by any combinations of constituent elements described in the first exemplary embodiment. In addition, other exemplary embodiments excluding some of the constituent elements may be practiced as exemplary embodiments of the present disclosure. In addition, modified examples including various changes from the above exemplary embodiments and occurring to those skilled in the art without departing from the subject matters of the present disclosure, i.e., the meaning of the recitations in the claims, are also included in the present disclosure.

Other exemplary embodiments are therefore described hereinafter.

Figure 12:
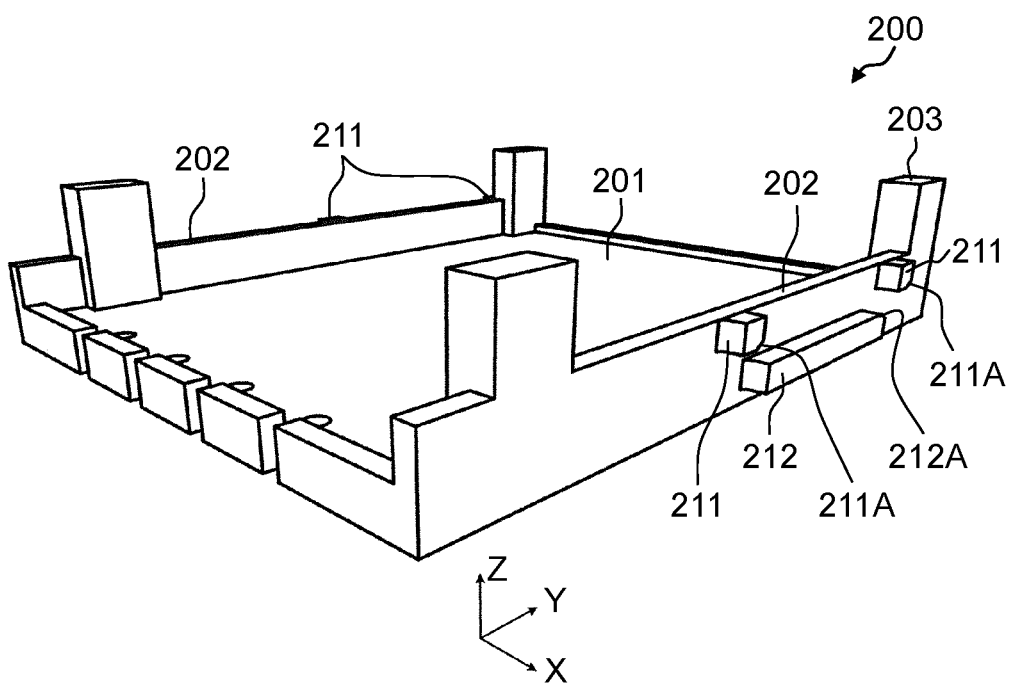
FIG. 12 is a perspective view schematically illustrating an example of first claws and second claws according to another exemplary embodiment.

According to the manufacturing method described in the present exemplary embodiment, cover member 200 can be attached to wiring board 110 after component 101 is mounted on wiring board 110. In this case, cover member 200 is attached to wiring board 110 from the soldering surface side of wiring board 110, and detached from the soldering surface side. When cover member 200 is attached to wiring board 110 from the soldering surface side (i.e., when shift direction for attaching cover member 200 to wiring board 110 is Z axis positive direction), only first claws 211 pass through notches 104 during both attachment of cover member 200 to wiring board 110, and detachment of cover member 200 from wiring board 110. However, second claws 212 do not pass through notches 104. Accordingly, second claws 212 in this configuration may be so positioned or shaped as not to pass through notches 104. FIG. 12 is a perspective view schematically illustrating an example of first claws and second claws according to another exemplary embodiment. For example, when cover body 201 is attached from the side of the soldering surface (Z axis negative side surface) of wiring board 110, and detached from the soldering surface side, second claws 212 of cover member 200 are not inserted into notches 104. Accordingly, as illustrated in FIG. 12, second claws 212 may not be disposed in parallel with first claws 211 in a thick direction (Z axis direction), but be shifted from first claws 211 in the sliding direction of cover member 200 (Y axis direction). Moreover, each shape of second claws 212 is not required to be associated with each shape of notches 104 of wiring board 110. Accordingly, any shape may be adopted for second claws 212. For example, as illustrated in FIG. 12, each of second claws 212 may have a shape extended in the Y axis direction.

According to the configuration example described in the present exemplary embodiment, two notches 104 are provided for each of two edges 102A. However, the present disclosure is not limited to this configuration at all. According to the configuration example described in the present exemplary embodiment, the plurality of notches 104 are provided for each of two edges 102A to secure stability during attachment of cover member 200 to wiring board 110. However, this configuration is presented only by way of example. For example, one notch 104 may be provided for each of two edges 102A.

The size and shape of each of first claws 211 and second claws 212 of the present exemplary embodiment are not limited to the size and shape described in the exemplary embodiment herein. Any sizes and shapes of first claws 211 and second claws 212 may be adopted without departing from the effects intended to be achieved by the present disclosure.

The positions of notches 104 in wiring board 110 are not limited to the positions described in the above exemplary embodiment at all. Notches 104 formed in one edge 102A of two facing edges 102A of hole 102 included in wiring board 110 may be disposed at positions facing notches 104 formed in other edge 102A, rather than positions shifted from notches 104 formed in other edge 102A. In addition, when a plurality of notches 104 are formed in each of two edges 102A, the distance between notches 104 formed in one edge 102A may be different from the distance between notches 104 formed in other edge 102A.

Note that notches 104 formed in one edge 102A are disposed at positions shifted from notches 104 formed in other edge 102A (positions shifted in Y axis direction) in the configuration example described in the present exemplary embodiment. Notches 104 are formed at these positions in edges 102A to prevent insertion of cover member 200 into wiring board 110 in the opposite direction, and thereby increase stability of cover member 200 attached to wiring board 110. However, the present disclosure is not limited to this configuration at all. For example, even when notches 104 formed in one edge 102A and notches 104 formed in other edge 102A are disposed at positions not facing each other in the X axis direction, cover member 200 is allowed to be attached to wiring board 110 in the opposite direction in a state that respective notches 104 are point-symmetrically disposed with respect to a center point of hole 102. However, when notches 104 formed in one edge 102A and notches 104 formed in other edge 102A are disposed not point-symmetrically with respect to the center point of hole 102, insertion of cover member 200 into wiring board 110 in the opposite direction is prevented. For example, even when notches 104 formed in one edge 102A and notches 104 formed in other edge 102A are disposed at positions facing each other in the X axis direction, insertion of cover member 200 into wiring board 110 in the opposite direction is preventable in the state that respective notches 104 are not point-symmetrically disposed with respect to the center point of hole 102.

According to the configuration example described in the present exemplary embodiment, second claws 212 are provided for each of two wall portions 202 facing each other. However, the present disclosure is not limited to this configuration at all. Second claws 212 are required to be provided on at least either one of two wall portions 202. For example, second claws 212 of cover member 200 may be provided only on one of two wall portions 202 as long as cover member 200 can be held with sufficient stability.

According to the configuration example described in the present exemplary embodiment, first claws 211 provided on one and other wall portions 202 facing each other are disposed at positions shifted from each other (positions shifted from each other in Y axis direction). However, the present disclosure is not limited to this configuration at all. Similarly to notches 104 described above, first claws 211 provided on one and other wall portions 202 facing each other may be similarly disposed at positions facing each other in the X axis direction. First claws 211 and notches 104 are required to be provided in correspondence with each other.

According to the configuration example described in the present exemplary embodiment, paired first claws 211 and second claws 212 are disposed at the same positions as viewed in the Z axis direction (i.e., positions facing each other in Z axis direction). However, the present disclosure is not limited to this configuration at all. First claws 211 and second claws 212 may be disposed at positions shifted from each other as viewed in the Z axis direction (i.e., positions not facing each other in Z axis direction). For example, when cover member 200 which includes first claws 211 and second claws 212 disposed at positions shifted from each other as viewed in the Z axis direction (hereinafter also referred to as "cover member 200 including first claws 211 and second claws 212 not facing each other") is inserted into hole 102 from the component mounting surface side of wiring board 110 and attached to wiring board 110, first claws 211 come into contact with edges 102A of hole 102 after second claws 212 pass through notches 104 (see FIGS. 13 and 14). Accordingly, even when an operator makes operational errors such as a slip from a hand of the operator during insertion of cover member 200, which has first claws 211 and second claws 212 not facing each other, into hole 102 from the component mounting surface side of wiring board 110 for attachment to wiring board 110, first claws 211 does not pass through notches 104 subsequently after passage of second claws 212 through notches 104. Accordingly, a drop of cover member 200 from hole 102 is prevented.

According to the configuration example described in the present exemplary embodiment, handles 203 are provided on cover member 200. Handles 203 thus provided improve work efficiency for attaching cover member 200 to wiring board 110 by the operator, and reduce operational errors such as a slip from the hand of the operator.

Note that a slide amount of cover member 200, which includes first claws 211 and second claws 212 not facing each other, at the time of insertion into hole 102 from the component mounting surface side of wiring board 110 to attach cover member 200 to wiring board 110, and detachment of cover member 200 from the soldering surface side after application of solder (shift amount of sliding of cover member 200 relative to wiring board 110) may be larger than a slide amount of cover member 200 which includes first claws 211 and second claws 212 disposed at the same positions as viewed in the Z axis direction (hereinafter also referred to as "cover member 200 including first claws 211 and second claws 212 facing each other"). An action in this situation is hereinafter described with reference to FIGS. 13 and 14.

Figure 13:
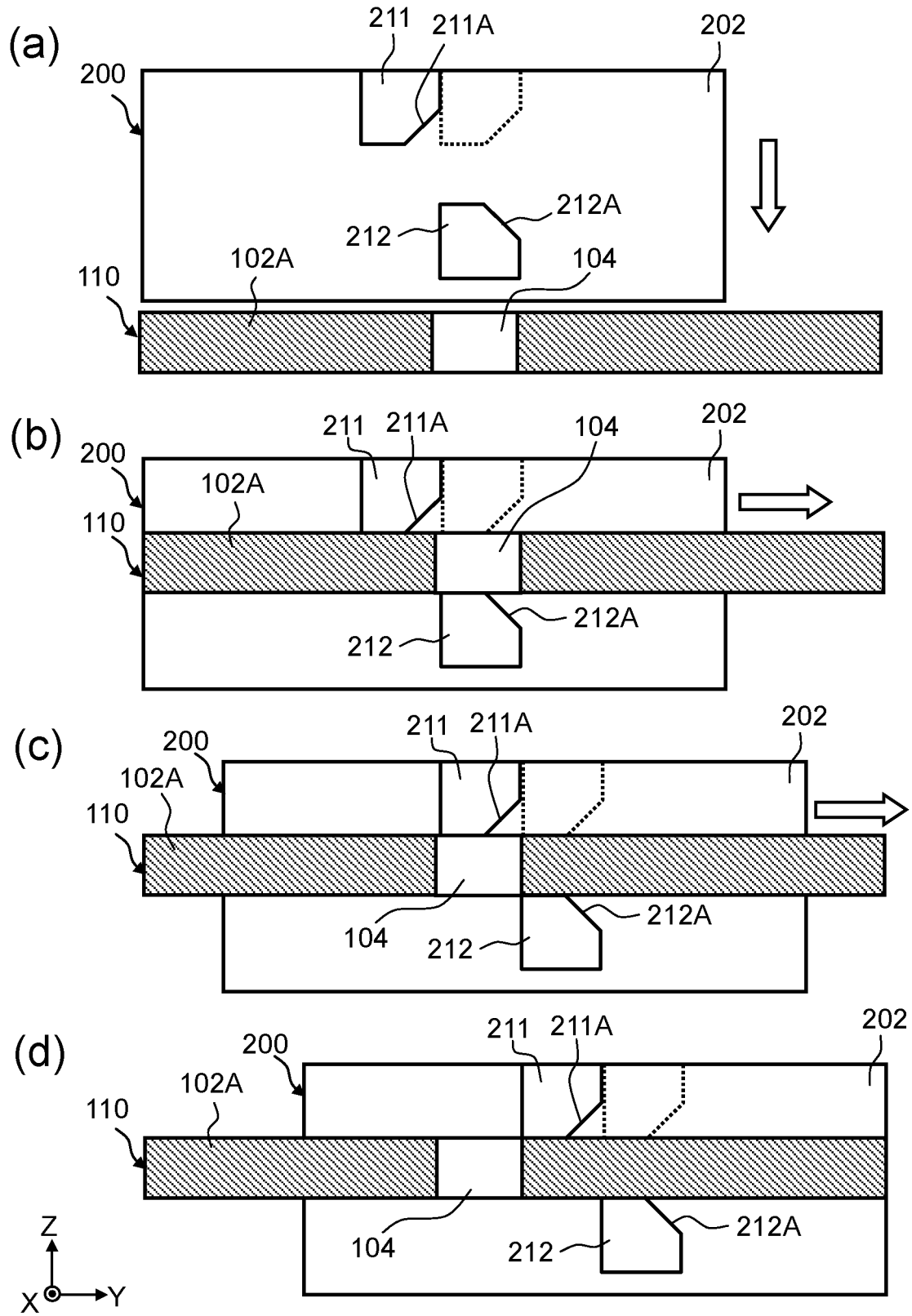
FIG. 13 is a view schematically illustrating a cover member according to still another exemplary embodiment having the first claws and the second claws not facing each other, and illustrating an action performed for attachment of the cover member to the wiring board and detachment of the cover member from the wiring board.

FIG. 13 is a view schematically illustrating an action for attachment of cover member 200 to wiring board 110 and detachment of cover member 200 from wiring board 110 according to still another exemplary embodiment. Cover member 200 in this exemplary embodiment includes first claws 211 and second claws 212 not facing each other.

Figure 14:
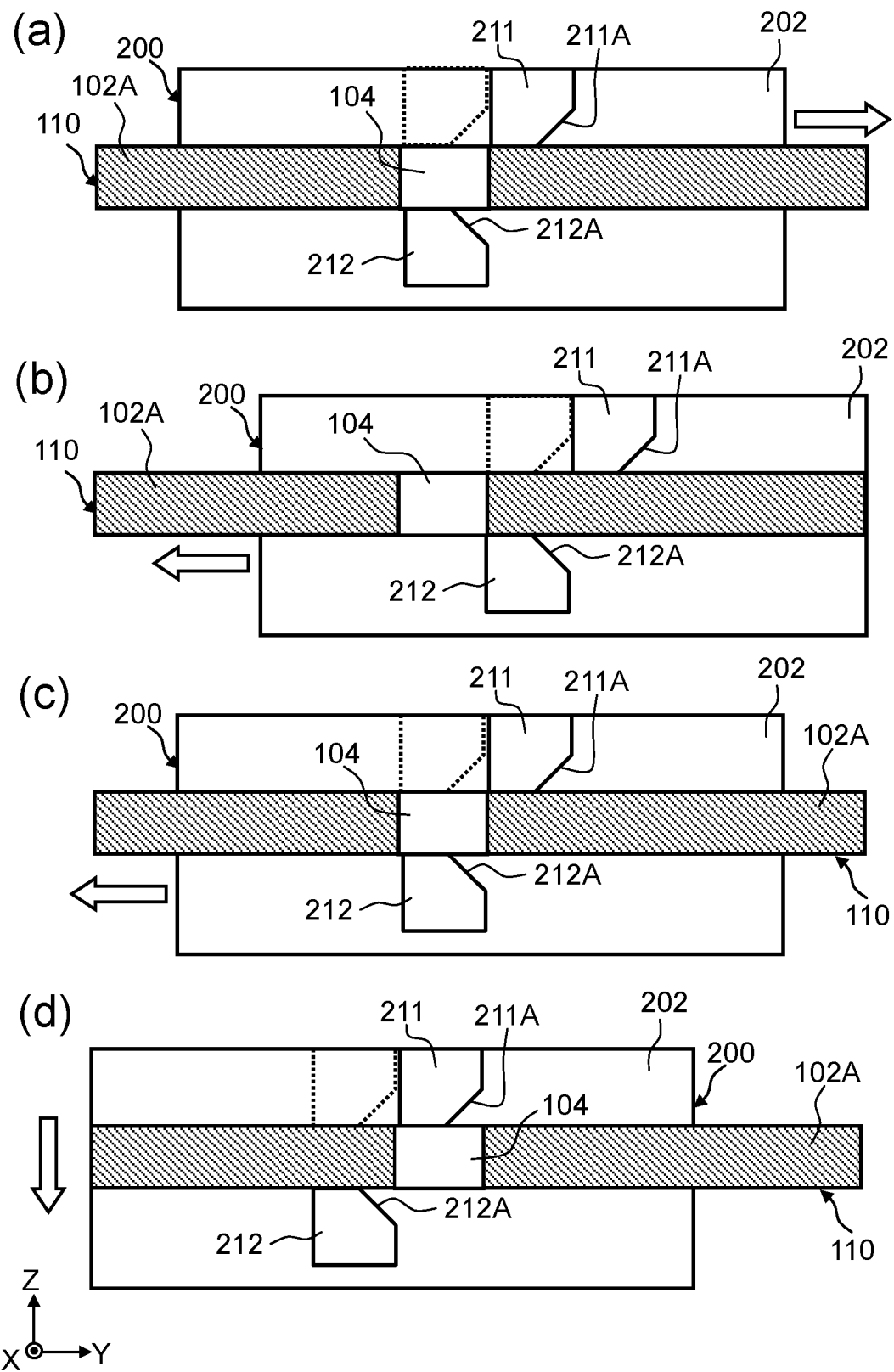
FIG. 14 is a view schematically illustrating a cover member according to yet another exemplary embodiment having the first claws and the second claws not facing each other, and illustrating an action performed for attachment of the cover member to the wiring board and detachment of the cover member from the wiring board.

FIG. 14 is a view schematically illustrating an action for attachment of cover member 200 to wiring board 110 and detachment of cover member 200 from wiring board 110 according to yet another exemplary embodiment. Cover member 200 in this exemplary embodiment includes first claws 211 and second claws 212 not facing each other.

Note that FIG. 13 illustrates an action when first claw 211 is disposed behind (Y axis negative side of) second claw 212 in the sliding direction of cover member 200 for attachment to wiring board 110 (Y axis positive direction), while FIG. 14 illustrates an action when first claw 211 is disposed in front of (Y axis positive side of) second claw 212 in the sliding direction of cover member 200 for attachment to wiring board 110 (Y axis positive direction) In addition, first claw 211 of cover member 200 which includes first claws 211 and second claws 212 facing each other is indicated by a broken line in each of FIGS. 13 and 14 for comparison.

With reference to FIG. 13, description will now be given of the action performed for attaching cover member 200 to wiring board 110 when first claws 211 of cover member 200 are disposed on the Y axis negative side with respect to second claws 212.

For insertion of cover member 200 into hole 102 from the component mounting surface side of wiring board 110, the position of cover member 200 is initially determined such that second claw 212 is located directly above notch 104 (such that second claw 212 is accommodated within notch 104 as viewed in Z axis direction) (see part (a) of FIG. 13).

Subsequently, cover member 200 is shifted in a direction indicated by an arrow in part (a) of FIG. 13 (Z axis negative direction) such that second claw 212 can pass through notch 104. First claw 211 is disposed on the Y axis negative side with respect to second claw 212. Accordingly, after second claw 212 passes through notch 104, first claw 211 comes into contact with edge 102A of hole 102 as illustrated in part (b) of FIG. 13.

Subsequently, cover member 200 is slid in a direction indicated by an arrow in part (b) of FIG. 13 (Y axis positive direction) from the position indicated in part (b) of FIG. 13 to position edge 102A of hole 102 between first claw 211 and second claw 212.

A sliding amount of cover member 200 at this time is an amount from passage of first claw 211 above notch 104 (see part (c) of FIG. 13) until arrival of first claw 211 at a position for positioning edge 102A of hole 102 between first claw 211 and second claw 212 (see part (d) of FIG. 13). For example, according to the example illustrated in FIG. 13, the sliding amount of cover member 200 at this time (shift amount for sliding cover member 200 from position illustrated in part (b) of FIG. 13 to position illustrated in part (d) of FIG. 13) is approximately an amount of a sum of a width of notch 104 in the Y axis direction and a shift amount of first claw 211 from second claw 212 in the Y axis direction.

Note that cover member 200, which includes first claws 211 and second claws 212 facing each other, with first claw 211 located at the position indicated by the broken line, need not be slid from the position indicated in part (b) of FIG. 13 to the position indicated in part (d) of FIG. 13. Even when sliding of cover member 200 is stopped at the position indicated in part (c) of FIG. 13, edge 102A of hole 102 can be positioned between first claw 211 and second claw 212. The sliding amount of cover member 200 at this time (shift amount for sliding of cover member 200 from position illustrated in part (b) of FIG. 13 to position illustrated in part (c) of FIG. 13) is approximately the width of notch 104 in the Y axis direction, for example.

As described above, the sliding amount of cover member 200 which includes first claws 211 disposed on the Y axis negative side with respect to second claws 212 (behind in sliding direction for attaching cover member 200 to wiring board 110) at the time of attachment of cover member 200 to wiring board 110 is larger than the sliding amount of cover member 200 which includes first claws 211 and second claws 212 facing each other.

Note that cover member 200 which includes first claws 211 disposed on the Y axis negative side with respect to second claws 212 is simply required to slide in the opposite direction (Y axis negative direction) from the position indicated in part (d) of FIG. 13 to the position indicated in part (c) of FIG. 13 at the time of detachment of cover member 200 from the soldering surface side after application of solder. The sliding amount of cover member 200 at this time is approximately equivalent to the width of notch 104 in the Y axis direction, and substantially equivalent to the sliding amount of cover member 200 which includes first claws 211 and second claws 212 facing each other with first claw 211 disposed at the position indicated by the broken line at the time of detachment of cover member 200 from the soldering surface side of wiring board 110 (shift amount for sliding cover member 200 from position indicated in part (c) of FIG. 13 to position indicated in part (b) of FIG. 13).

With reference to FIG. 14, description will now be given of the action performed for attaching cover member 200 to wiring board 110 and detaching cover member 200 from wiring board 110 when cover member 200 includes first claws 211 disposed on the Y axis positive side with respect to second claws 212.

The action until second claw 212 passes through notch 104 is similar to the corresponding action described above, and therefore is not repeatedly described.

First claw 211 is disposed on the Y axis positive side with respect to second claw 212. Accordingly, after second claw 212 passes through notch 104, first claw 211 comes into contact with edge 102A of hole 102 as illustrated in part (a) of FIG. 14.

Subsequently, cover member 200 is slid in a direction indicated by an arrow in part (a) of FIG. 14 (Y axis positive direction) to position edge 102A of hole 102 between first claw 211 and second claw 212.

A sliding amount of cover member 200 at this time is an amount until arrival of second claw 212 at a position for positioning edge 102A of hole 102 between first claw 211 and second claw 212 (see part (b) of FIG. 14). According to the example illustrated in FIG. 14, for example, the sliding amount of cover member 200 at this time (shift amount for sliding cover member 200 from position indicated in part (a) of FIG. 14 to position indicated in part (b) of FIG. 14) is approximately equivalent to the width of notch 104 in the Y axis direction, and substantially equivalent to the sliding amount of cover member 200 which includes first claws 211 and second claws 212 facing each other with first claw 211 located at the position indicated by the broken line.

At the time of detachment of cover member 200 from the soldering surface side after application of solder, cover member 200 is slid in a direction indicated by an arrow in part (b) of FIG. 14 (Y axis negative direction) from the position indicated in part (b) of FIG. 14.

A sliding amount of cover member 200 at this time is an amount from passage of second claw 212 below notch 104 (see part (c) of FIG. 14) until arrival of second claw 212 at a position at which first claw 211 is positioned directly above notch 104 (position at which first claw 211 is accommodated within notch 104 as viewed in Z axis direction) (see part (d) of FIG. 14). For example, according to the example illustrated in FIG. 14, the sliding amount of cover member 200 at this time (shift amount for sliding cover member 200 from position illustrated in part (b) of FIG. 14 to position illustrated in part (d) of FIG. 14) is approximately an amount of the sum of the width of notch 104 in the Y axis direction and the shift amount of first claw 211 from second claw 212 in the Y axis direction.

Note that cover member 200, which includes first claws 211 and second claws 212 facing each other with first claw 211 located at the position indicated by the broken line, need not be slid from the position indicated in part (b) of FIG. 14 to the position indicated in part (d) of FIG. 14 at the time of detachment of cover member 200 from the soldering surface side. Cover member 200 is required to stop sliding at the position indicated in part (c) of FIG. 14. The sliding amount of cover member 200 at this time (shift amount for sliding cover member 200 from position illustrated in part (b) of FIG. 14 to position illustrated in part (c) of FIG. 14) is approximately the amount of the width of notch 104 in the Y axis direction, for example.

As described above, the sliding amount of cover member 200 which includes first claws 211 disposed on the Y axis positive side with respect to second claws 212 (front side in sliding direction for attaching cover member 200 to wiring board 110) at the time of detachment of cover member 200 from the soldering surface side of wiring board 110 is larger than a sliding amount of cover member 200 which includes first claws 211 and second claws 212 facing each other.

The exemplary embodiments have been by way of example of the technology of the present disclosure. The accompanying drawings and the detailed description have been provided for this purpose.

Accordingly, the constituent elements illustrated and described in the accompanying drawings and the detailed description may include not only the constituent elements that are essential for solving the problems, but also the constituent elements that are not essential for solving the problems which are used for the exemplification of the technology described above. For this reason, those inessential constituent elements that are illustrated in the accompanying drawings or are described in the detailed description should not immediately be acknowledged as essential.

The above exemplary embodiments are used for the exemplification of the technology of the present disclosure, so that various modifications, replacements, additions, omissions, and others can be made within the scope of the claims or equivalents of the claims.

INDUSTRIAL APPLICABILITY

The present disclosure is applicable to a circuit board mounted on an electronic device or an electric device. More specifically, the present disclosure is applicable to a circuit board mounted on a device requiring thickness reduction, such as a television, a smartphone, and a tablet terminal.

REFERENCE MARKS IN THE DRAWINGS

100: circuit board
101: component
102: hole
102A, 102B: edge
103: solder connection portion
104: notch
110: wiring board
111: electrode terminal
112: body portion
131: attachment hole
200: cover member
201: cover body
202: wall portion
203: handle
211: first claw
211A, 212A: tapered portion
212: second claw

The invention claimed is:

1. A method for manufacturing a circuit board including a wiring board that has a hole in which a body portion of a component is disposed in an inserted state, the method comprising:
inserting either a first claw or a second claw through a notch formed by notching an edge of the hole, the first claw and the second claw being provided on a wall portion of a cover member that covers the body portion from a soldering surface side, the first claw and the second claw projecting outward from the wall portion;
holding the cover member on the wiring board, by sliding the cover member relative to the wiring board in a direction along a component mounting surface of the wiring board to position the edge of the hole between the first claw and the second claw provided on a surface of the wall portion identical to a surface on which the first claw is provided;
inserting the body portion into the hole, and disposing an electrode terminal of the body portion on the wiring board;
applying solder, by flow soldering, to the wiring board on which the cover member is held; and
detaching the cover member from the wiring board, by sliding the cover member relative to the wiring board to which solder has been applied to shift the first claw from the component mounting surface side to the soldering surface side with the first claw passing through the notch.

* * * * *